(12) United States Patent
De Metsenaere et al.

(10) Patent No.: US 8,786,830 B2
(45) Date of Patent: Jul. 22, 2014

(54) IMMERSION LITHOGRAPHIC APPARATUS INCLUDING A PRESSURE SENSOR TO MEASURE PRESSURE OF THE IMMERSION LIQUID AND A DEVICE MANUFACTURING METHOD

(75) Inventors: Christophe De Metsenaere, Eindhoven (NL); Ronald Casper Kunst, Geldrop (NL); Paul Petrus Joannes Berkvens, Veldhoven (NL); Mauritius Gerardus Elisabeth Schneiders, Eindhoven (NL); Jimmy Matheus Wilhelmus Van De Winkel, Kessel (NL); Gregory Martin Mason Corcoran, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 475 days.

(21) Appl. No.: 12/761,038

(22) Filed: Apr. 15, 2010

(65) Prior Publication Data

US 2010/0290013 A1    Nov. 18, 2010

Related U.S. Application Data

(60) Provisional application No. 61/178,336, filed on May 14, 2009.

(51) Int. Cl.
*G03B 27/58* (2006.01)
*G03B 27/32* (2006.01)

(52) U.S. Cl.
USPC ............................................. 355/72; 355/77

(58) Field of Classification Search
CPC ... G03B 27/52; G03F 7/0241; G03F 7/70341; G03F 7/70725; G03F 7/7085; G03F 7/70716; G03F 7/709

See application file for complete search history.

(56) References Cited

U.S. PATENT DOCUMENTS

| | | | |
|---|---|---|---|
| 4,509,852 | A | 4/1985 | Tabarelli et al. |
| 7,119,876 | B2 | 10/2006 | Van Der Toorn et al. |
| 7,295,283 | B2 | 11/2007 | Cox et al. |
| 7,426,014 | B2 | 9/2008 | Sogard |
| 7,924,404 | B2 | 4/2011 | Van Der Net |
| 8,035,800 | B2 | 10/2011 | Nishii |

(Continued)

FOREIGN PATENT DOCUMENTS

| | | | |
|---|---|---|---|
| EP | 1420298 | A | 5/2004 |
| EP | 1420300 | A | 4/2010 |

(Continued)

OTHER PUBLICATIONS

Korean Office Action dated May 9, 2012 in corresponding Korean Patent Application No. 10-2010-0045040.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

An immersion lithographic apparatus has a pressure sensor configured to measure the pressure of immersion liquid in a space between the substrate and a projection system. A control system is responsive to a pressure signal generated by the pressure sensor and controls a positioner to exert a force on the substrate table to compensate for the force exerted on the substrate table by the immersion liquid.

21 Claims, 5 Drawing Sheets

(56) References Cited

U.S. PATENT DOCUMENTS

| | | | |
|---|---|---|---|
| 2004/0165159 A1* | 8/2004 | Lof et al. | 355/30 |
| 2004/0207824 A1 | 10/2004 | Lof et al. | |
| 2005/0219481 A1* | 10/2005 | Cox et al. | 355/18 |
| 2006/0038968 A1 | 2/2006 | Kemper et al. | |
| 2006/0119809 A1 | 6/2006 | Verhagen et al. | |
| 2007/0177118 A1* | 8/2007 | Sogard | 355/53 |
| 2008/0013064 A1 | 1/2008 | Nishii | |
| 2008/0212046 A1 | 9/2008 | Riepen et al. | |

FOREIGN PATENT DOCUMENTS

| | | |
|---|---|---|
| JP | 2005-294846 | 10/2005 |
| JP | 2006-121077 | 5/2006 |
| JP | 2007-281441 | 10/2007 |
| JP | 2008-505485 | 2/2008 |
| JP | 2009-049406 | 3/2009 |
| KR | 10-2006-0109888 | 10/2006 |
| KR | 10-2007-0031432 | 3/2007 |
| WO | 99/49504 | 9/1999 |
| WO | 2005/064405 | 7/2005 |

OTHER PUBLICATIONS

U.S. Appl. No. 61/071,621, filed May 8, 2008.
U.S. Appl. No. 61,136,380, filed Sep. 2, 2008.
Japanese Office Action mailed Jan. 18, 2012 in corresponding Japanese Patent Application No. 2010-106827.
Chinese Office Action dated dated Apr. 9, 2013 in corresponding Chinese Patent Application No. 201010176682.3.

* cited by examiner

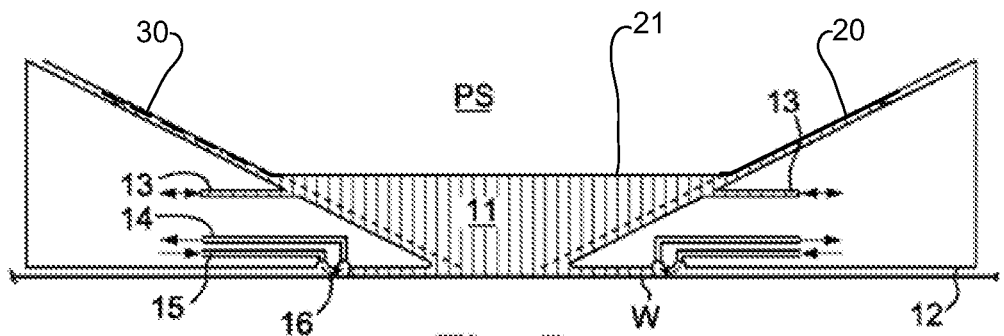
Fig. 5
Fig. 6
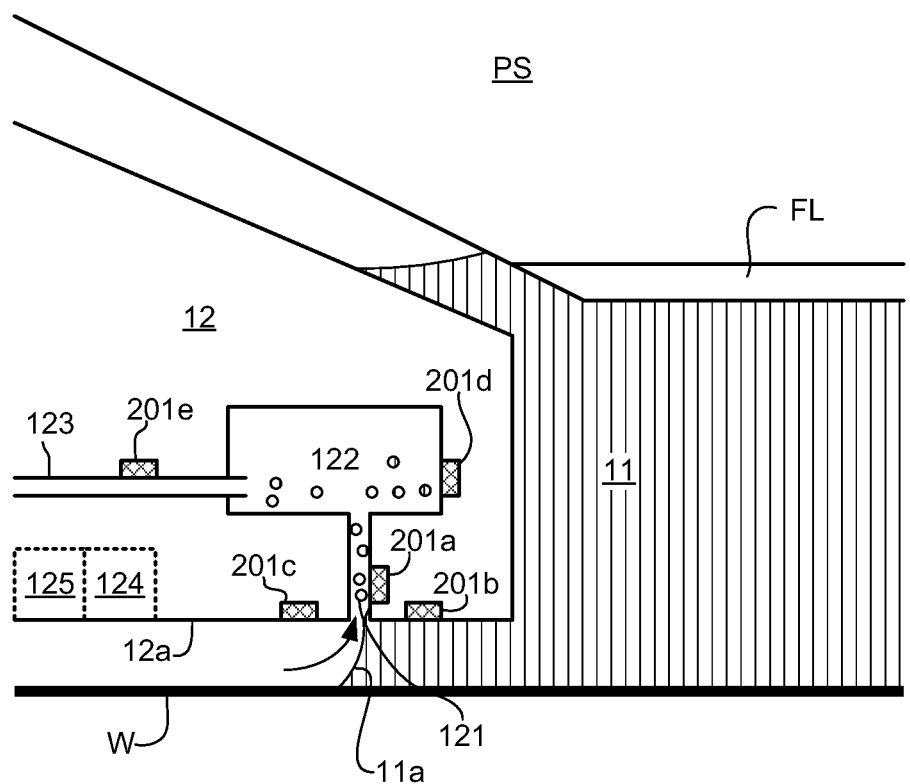

IMMERSION LITHOGRAPHIC APPARATUS INCLUDING A PRESSURE SENSOR TO MEASURE PRESSURE OF THE IMMERSION LIQUID AND A DEVICE MANUFACTURING METHOD

CROSS REFERENCE TO RELATED APPLICATIONS

This application claims priority and benefit under 35 U.S.C. §119(e) to U.S. Provisional Patent Application No. 61/178,336, entitled "An Immersion Lithographic Apparatus and A Device Manufacturing Method", filed on May 14, 2009. The content of that application is incorporated herein in its entirety by reference.

FIELD

The present invention relates to an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate, or substrate and substrate table, in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2, the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Another arrangement which has been proposed is to provide the liquid supply system with a seal member. The seal member may extend along at least a part of a boundary of the space between the final element of the projection system and the substrate table. Such an arrangement is illustrated in FIG. 4. In the cross-sectional view of FIG. 4, arrows illustrate the direction of liquid flow in and out of openings in the seal member. The seal member is substantially stationary relative to the projection system in the XY plane though there may be some relative movement in the Z direction (in the direction of the optical axis). A seal is formed between the seal member and the surface of the substrate. Desirably the seal is a contactless seal such as a gas seal. Such a system with a gas seal is disclosed in EP-A-1,420,298 and illustrated in FIG. 5.

In EP-A-1,420,300 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

WO2005/064405 discloses an all wet arrangement in which the immersion liquid is unconfined. In such a system the whole top surface of the substrate is covered in liquid. This is beneficial because then the whole top surface of the substrate is exposed to the same conditions. This has benefits for temperature control and processing of the substrate. In WO2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid can still occur. One way of alleviating that problem is described in US 2006/119809 in which a member is provided which covers the substrate W in all positions and which is arranged to have immersion liquid extending between it and the top surface of the substrate and/or substrate table which holds the substrate.

SUMMARY

In an immersion lithographic apparatus, the immersion liquid provided in the space between the final element of the projection system and the substrate exerts a force on a facing surface such as a substrate or a substrate table. The force exerted by the immersion liquid may fluctuate and disturb the position of the substrate and/or the substrate table. If as a result of this fluctuating force the substrate is displaced from its desired position, this can lead to focus and/or overlay errors or even blurring of the printed image. The forces exerted on the substrate by the immersion liquid can be countered by a positioner of the substrate table, in particular a short stroke module of the positioner. However, control of counteracting forces to be exerted by the positioner is difficult.

It is desirable, for example, to provide an improved arrangement to predict forces exerted on the substrate by the immersion liquid and to control forces exerted by a positioner to counteract such disturbance forces.

According to an aspect of the invention, there is provided an immersion lithographic apparatus having a projection system arranged to project an image onto a substrate held by a substrate table through an immersion liquid provided in a space between the projection system and the substrate, the apparatus including: a pressure sensor configured to generate a pressure signal indicative of the pressure of the immersion liquid in the space; a positioner configured to position the substrate table relative to the projection system; and a control system responsive to the pressure signal and configured to control the force applied to the substrate table by the positioner.

According to an aspect of the invention, there is provided a device manufacturing method, including projecting a patterned beam of radiation onto a substrate held by a substrate table through an immersion liquid provided in a space adjacent the substrate using a lithographic apparatus, the method including: measuring the pressure of the immersion liquid in the space; and controlling the force applied to the substrate table by a positioner responsive to the pressure.

According to an aspect of the invention, there is provided an immersion lithographic apparatus having a projection system arranged to project an image onto a substrate held by a substrate table through an immersion liquid provided in a space between the projection system and the substrate, the apparatus including: an extraction conduit configured to extract immersion liquid from the space along with a gas in a two-phase flow; and a pressure sensor located in or near the inlet of the extraction conduit and configured to generate a signal indication of the pressure of the immersion liquid in the space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts a part of a liquid supply system according to an embodiment of the invention;

DETAILED DESCRIPTION

Figure 1:
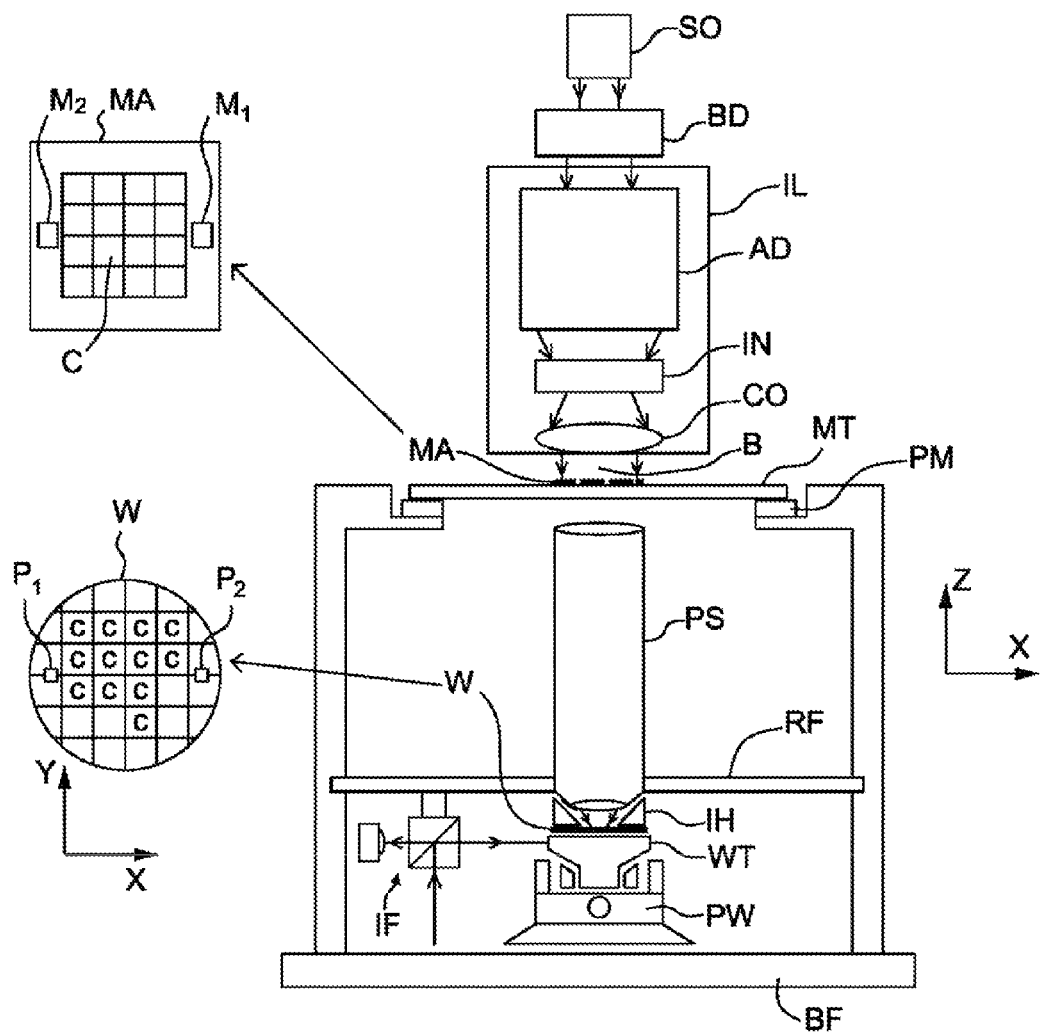
FIG. 1 depicts a lithographic apparatus according to an embodiment of the invention.
Figure 2:
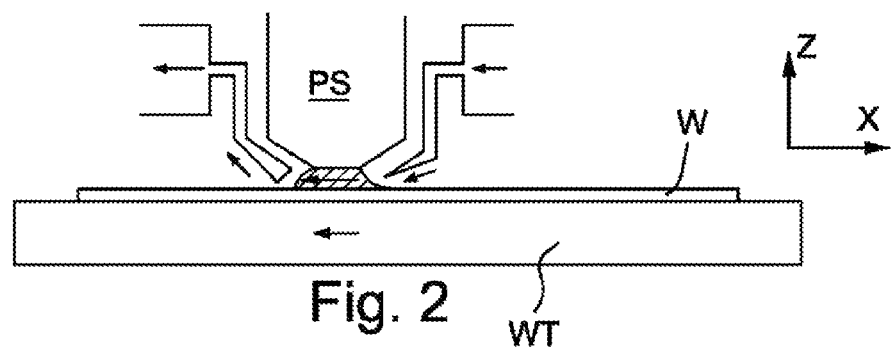
FIGS. 2 and 3 depict a liquid supply system for use in a lithographic projection apparatus.
Figure 3:
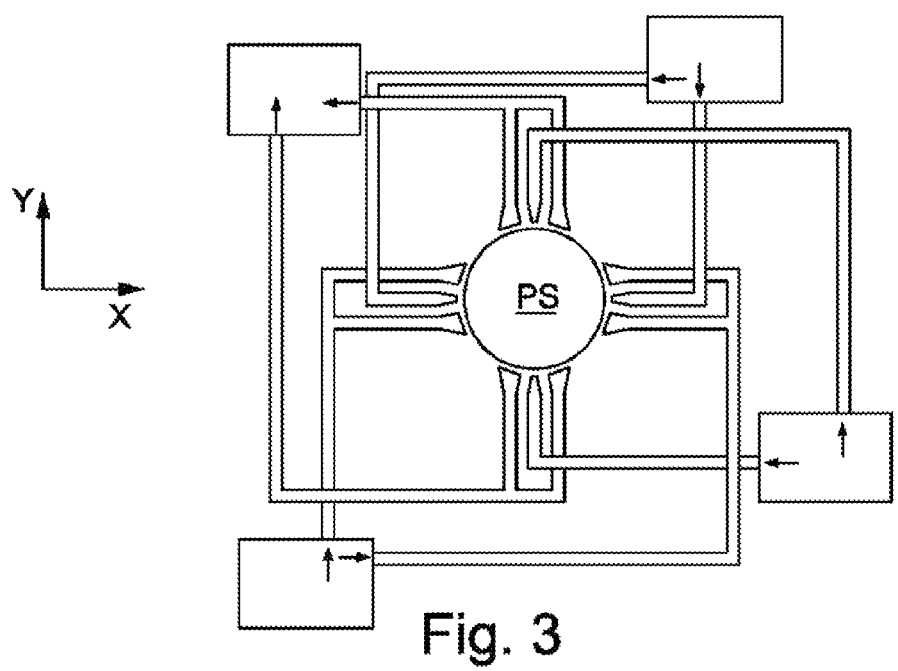
Figure 4:
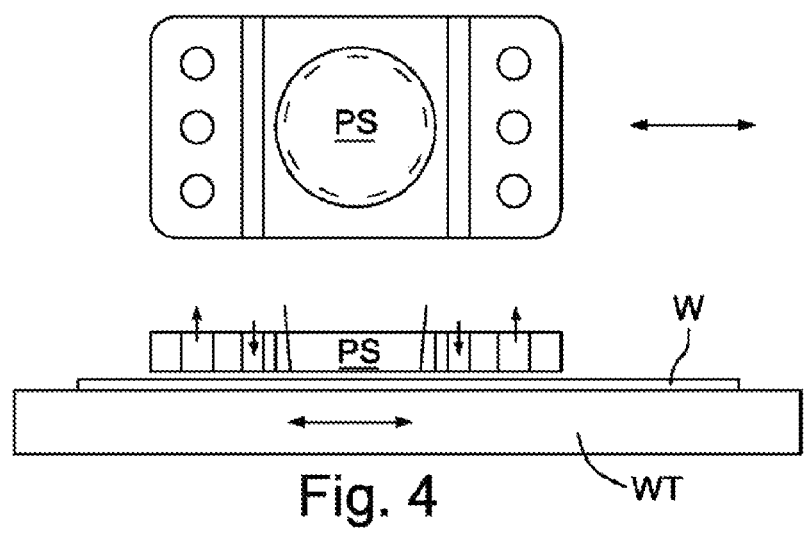
FIG. 4 depicts a further liquid supply system for use in a lithographic projection apparatus.

FIG. 1 schematically depicts a lithographic apparatus according to one embodiment of the invention. The apparatus includes an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device MA in accordance with certain parameters; a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, to direct, shape, or control radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system". In FIG. 1, a liquid supply system IH is provided to confine liquid between the projection system PS and the substrate W.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area.

A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area.

Four different types of localized liquid supply systems are illustrated in FIGS. 2-5. The liquid supply systems disclosed in FIGS. 2-4 were described above. Another arrangement which has been proposed is to provide the liquid supply system with a liquid confinement structure which extends along at least a part of a boundary of the space between the final element of the projection system and the substrate table. Such an arrangement is illustrated in FIG. 5.

The liquid confinement structure is substantially stationary relative to the projection system in the XY plane though there may be some relative movement in the Z direction (in the direction of the optical axis). A seal is formed between the liquid confinement structure and the surface of the substrate. In an embodiment, a seal is formed between the liquid confinement structure and the surface of the substrate and may be a contactless seal such as a gas seal. Such a system is disclosed in U.S. patent application publication no. US 2004-0207824.

FIG. 5 schematically depicts a localized liquid supply system (as an example of a fluid handling structure) with a body 12 forming a barrier member or liquid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid confinement structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a fluid (e.g. gas) seal or a capillary seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which may surround the space 11. Each annular groove may be continuous or discontinuous. The flow of gas is effective to contain the liquid in the space 11. Such a system is disclosed in U.S. patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in U.S. patent application publication no US 2006-0038968.

In an embodiment, a single phase extractor may include an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 µm. In an embodiment, the porous material is at least slightly lyophilic (e.g., hydrophilic), i.e. having a static contact angle of less than 90° relative to the immersion liquid, e.g. water.

Another arrangement which is possible is one which works on a gas drag principle. The so-called gas drag principle has been described, for example, in U.S. patent application publication No. US 2008-0212046 and U.S. patent application Ser.No. US 61/071,621 filed on 8 May 2008. In that system the extraction openings are arranged in a shape which desirably has a corner. The corner may be aligned with the stepping and scanning directions. This reduces the force on the meniscus between two openings in the surface of the fluid handling structure for a given speed in the step or scan direction compared to if the two outlets were aligned perpendicular to the direction of scan. In an embodiment the openings may be covered by a porous member.

An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application Ser.No. US 61/136,380 filed on 2 Sep. 2008 which document is hereby incorporated in its entirety by reference.

In an immersion lithographic apparatus, in particular an immersion lithographic apparatus in which the immersion liquid is localized to a space between a projection system and the substrate, forces may be exerted on the substrate and/or the substrate table by the immersion liquid. Please note that reference to application of a force such as by way of a vibration of pressure fluctuation to a substrate herein additionally or alternatively includes reference of application of the force to the substrate table, unless stated by the contrary. These forces may fluctuate. Fluctuations in the forces exerted by the immersion liquid on the substrate may be caused by movements of the liquid supply system, e.g. a liquid confinement structure 12. Such movements of the liquid supply system may cause fluctuations in the pressure of the immersion liquid, which then result in fluctuations in the force exerted on the substrate. It has been proposed to provide an accelerometer to measure movements of the liquid supply system. The measurements of the acceleration of the immersion supply system might then be used to predict the forces exerted on the substrate so that compensatory forces can be applied via the substrate table positioner PW. However, the present inventors have determined that the correlation between the accelerations of the liquid supply system and the forces exerted on the substrate table is poor. Therefore, a feedforward control of the force exerted by the positioner PW based measured on accelerations of the liquid supply system does not result in a significant reduction of positioning errors of the substrate.

In an embodiment of the invention, a pressure sensor is provided to measure, directly or indirectly, the pressure of the immersion liquid in the space between the final element FL of the projection system PS and the facing surface, e.g. substrate W or substrate table WT. The results of this measurement are used to control forces exerted on the substrate by the positioner PW in order to counteract any fluctuating forces exerted by the immersion liquid. In this way, the position of the substrate table can be maintained constant, reducing imaging errors, such as defocus, overlay and image blur.

FIG. 6 depicts a part of a liquid supply system including barrier member 12. As discussed above, barrier member 12 serves to largely confine immersion liquid 11 to the space between the final element FL and the substrate W. However, there is a gap between the lower surface 12a of barrier member 12 and substrate W through which immersion liquid 11 may escape. To prevent or limit escape of immersion liquid 11 through this gap, a seal such as a meniscus pinning device is provided. In this embodiment, this takes the form of a plurality of extraction conduits 121 spaced apart around the periphery of the barrier member 12 and opening into the lower surface 12a. The extraction conduits 121 are configured to operate according to the gas drag principle. They are connected to an under pressure (not shown) via a manifold 122 and a further extraction conduit 123. Manifold 122 may take the form of an annular or substantially annular chamber within the barrier member 12. As a result of the under pressure, gas, e.g. air from the surroundings, is drawn into the extraction conduits 121 and carries with it immersion liquid from the meniscus 11a to form a two-phase flow in the extraction conduit. In an embodiment, the barrier member 12 is also provided with a pressure control device 124, which may take the form of a leak to atmospheric pressure, and a gas knife device 125 to deal with any liquid that may be left behind on the substrate W.

The pressure sensor that is used to generate a control signal for the positioner PW may be provided in several different locations. For example, a pressure sensor 201a may be provided at or near the inlet of one of the extraction conduits 121. A plurality of pressure sensors 201a each provided at or near the inlet of a respective extraction conduit 121 may be used. The number of pressure sensors 201a may be equal to the number of extraction conduits 121 so that one pressure sensor is provided in each extraction conduit 121. Alternatively, the number of pressure sensors 201a may be less than the number of extraction conduits 121. In this case the pressure sensors 201a are desirably provided in a representative sample of the extraction conduits 121. For example, if the number of pressure sensors 201a is 1/N of the number of extraction conduits 121, the pressure sensors may be provided in every Nth extraction conduit, N being an integer, e.g. in the range of from 2 to 10.

In addition to or as an alternative to pressure sensor 201 a provided in the extraction conduit 121, one or more pressure sensors may be provided on the lower surface 12a of barrier member 12. For example, pressure sensor 201b is provided inside the meniscus pinning device formed by extraction conduits 121, for example radially inward with respect to an optical axis of the projection system PS, with the space occupied by immersion liquid 11 or toward the space occupied by immersion liquid 11. In an embodiment, pressure sensor 201c is provided outside the meniscus pinning device, for example radially outward with respect to an optical axis of the projection system PS, or outside the space occupied by immersion liquid 11, or further away from the space occupied by the immersion liquid 11 than is the meniscus pinning device. Where pressure sensors, such as pressure sensors 201b and 201c, are provided in the undersurface of barrier member 12, a plurality of such sensors may be provided spaced around barrier member 12. The number of pressure sensors provided in the lower surface 12a of barrier member 12 may be less than, equal to, or greater than the number of extraction conduits 121. The number of pressure sensors provided in lower surface 12a is desirably sufficient to accurately sample the pressure of the immersion liquid 11.

Also optionally or in addition, pressure sensor 201d may be provided to measure the pressure in manifold 122. The cross-sectional area and volume of manifold 122 are substantially larger than the cross-section and volume of extraction conduits 121 so that the pressure within manifold 122 is substantially uniform. Accordingly, a single pressure sensor 201d may be sufficient to accurately measure the pressure within manifold 122. It is however possible to provide a small number of pressure sensors 201d spaced around manifold 122, e.g. as redundant backups or to enable averaging to reduce error. Further, pressure sensor 201e may be provided to measure the pressure in extraction conduit 123 by which liquid and/or gas is extracted from manifold 122.

A suitable pressure sensor for use as any one of pressure sensors 201a to 201e is the XCL-100 miniature IS pressure transducer available from Kulite Semiconductor Products, Inc., 1 Willow Tree Road, Leonia, N.J. 07605, but each sensor or sensor combination, which is able to measure a pressure in a liquid and/or a gas may be used according to the invention.

Figure 7:
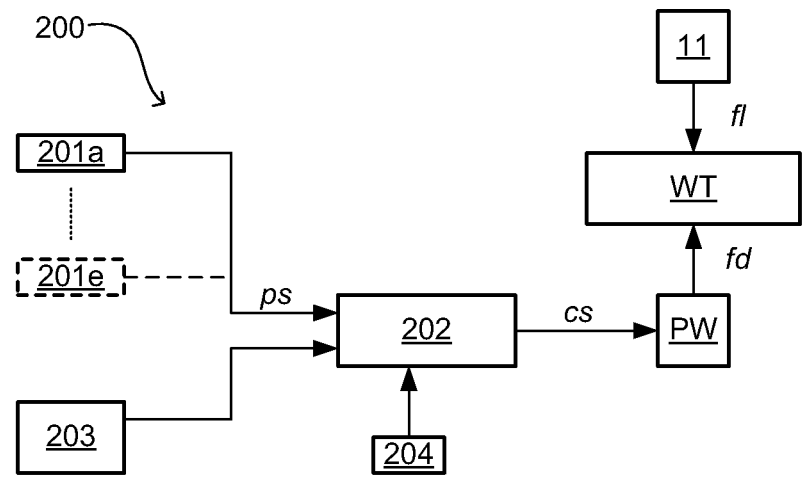
FIG. 7 depicts a control system according to an embodiment of the invention.

All of pressure sensors 201a to 201e generate a signal that is indicative of the pressure in immersion liquid 11 and/or the gas in the gap between barrier member 12 and substrate W. This pressure gives rise to a downward force on the substrate which must be counteracted by a force exerted by the positioner PW, in particular a short-stroke module of the positioner PW, in order to maintain the substrate in a desired position. Accordingly, the output signal ps of the pressure sensor or plurality of pressure sensors, is provided to a control system 200 shown in FIG. 7. Control system 200 includes a controller 202 which receives the pressure signal(s) ps generated by pressure sensor(s) 201a to 201e and generates a control signal cs that is supplied to positioner PW. In response to control signal cs, positioner PW exerts a force fd on substrate table WT, which counteracts the force fl exerted by immersion liquid 11. Controller 202 calculates control signal Cs from pressure signal ps on the basis of a predetermined transfer function which may be stored in memory device 204. In calculating control signal cs, controller 202 may take into account other disturbance forces or desired movement of the substrate table WT as provided by set-point generator 203. In addition or as an alternative to applying a counter-acting force via actuators, fluctuations in the pressure force exerted by the immersion liquid may be compensated for by varying the rate of extraction of gas and liquid through the meniscus pinning device and/or the rate of supply of immersion liquid.

In a simple arrangement employing a single pressure sensor or a plurality of pressure sensors whose outputs are summed or averaged, the transfer function may be a simple multiplication of the (summed or averaged) pressure signal by a calibration value. The calibration value may be derived empirically or theoretically. The calibration value may be regarded as equivalent to the area over which the pressure in the immersion liquid 11 is exerted on the substrate W since force is equal to pressure times area. However, the present inventors have determined that in an embodiment, the pressure in the immersion liquid 11 is substantially constant over most of the space inside barrier member 12. Fluctuations in the pressure of immersion liquid 11 are mostly localized to the area in the vicinity of the meniscus pinning device. Thus, the calibration value may be substantially less than the actual area of the immersion liquid on the substrate W.

In an embodiment where multiple pressure sensors are used, the output of each pressure sensor may be multiplied by its own calibration value and the resulting plurality of control signals combined to provide a single control signal to the position of PW. It is also possible to use a more complex transfer function if the net force on the substrate table is not linearly related to pressure as measured by the pressure sensors 201a to 201e.

Although the pressure of the immersion liquid exerts a force on the substrate that is normal to the surface of the substrate W, i.e. the Z direction as indicated in FIG. 1, that force will, in general, not be directed through the center of mass of the substrate W and substrate table WT. Therefore, the pressure force will also act to rotate the substrate W and substrate table WT about the X and Y axes. Therefore, unless the point of application of the compensatory force fd can be adjusted to directly oppose the pressure force fl, it is desirable that the positioner PW also exerts rotational forces Rx, Ry as well as transitional forces in the Z direction. If the pressure within the immersion liquid 11 is substantially spatially uniform, the rotational forces Rx, Ry, may be calculated based on the position of the substrate table WT relative to the projection system PS, which determines the position of application of the pressure force fl. However, it is possible also if multiple pressure sensors are provided, to take into account the spatial distribution of the pressure within immersion liquid 11 in order to calculate the rotational forces Rx, Ry.

Figure 8:
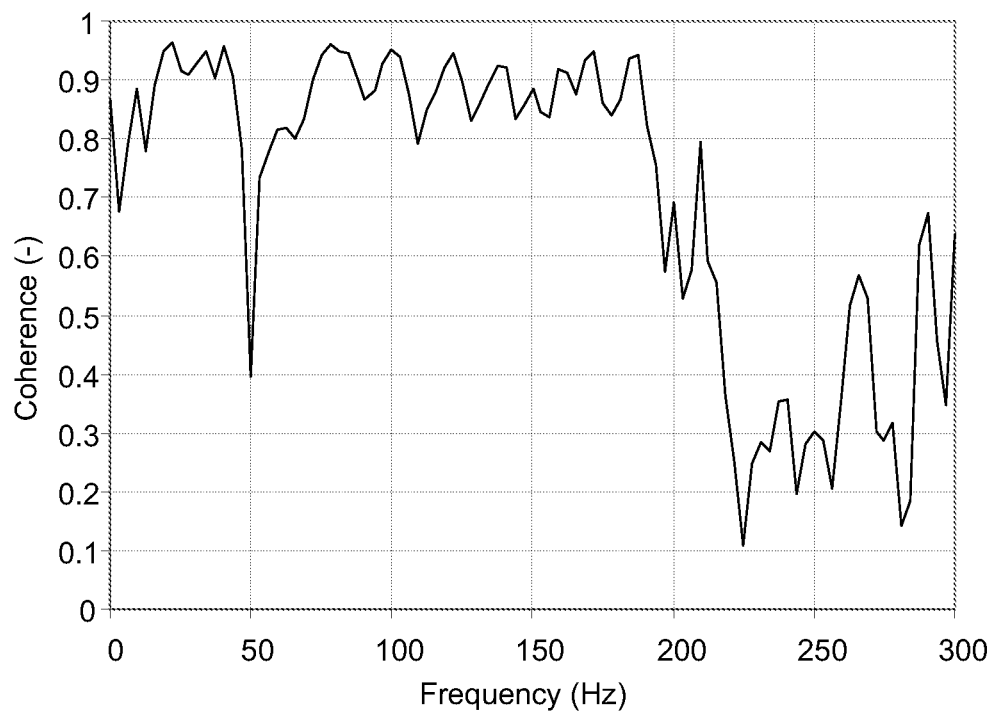
FIG. 8 is a graph showing coherence between the measured pressure signal and force exerted on the substrate table as a function of frequency.

FIG. 8 shows the results of measurements performed with an embodiment of the invention. The graph shows the degree of coherence between measurements of a pressure sensor (201a) in extraction conduit 121 and force exerted on the substrate W as a function of frequency. As can be seen, the coherence averages about 90% up to a frequency of about 150 Hz. This allows substantial reductions in the positioning error of the substrate in this frequency range, which is particularly critical to correct imaging.

Figure 9:
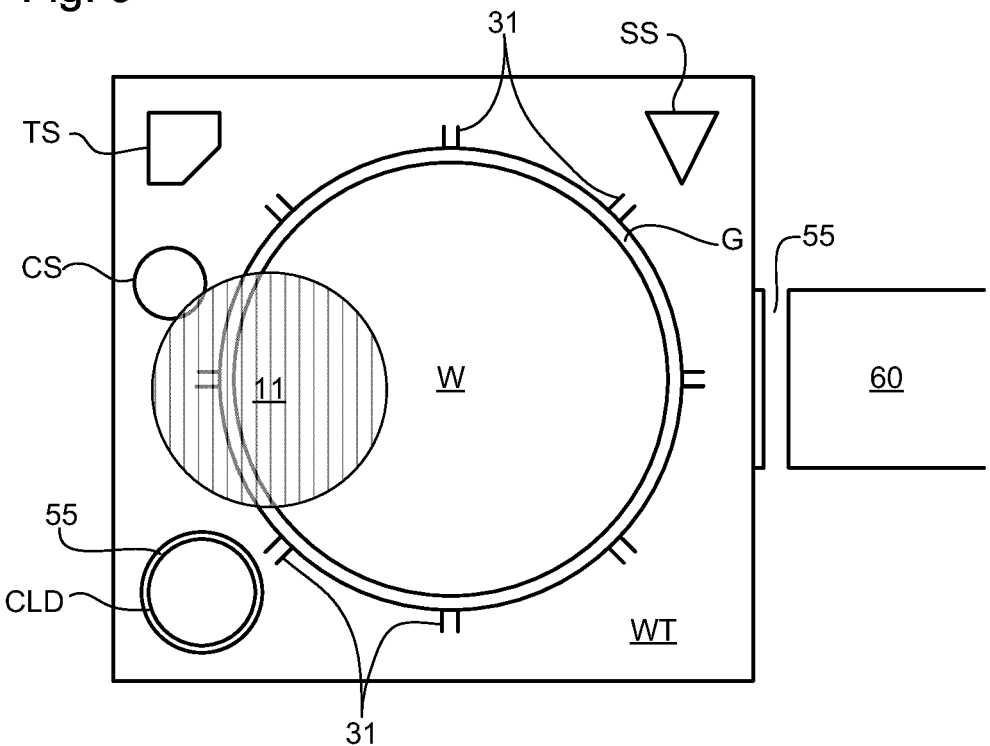
FIG. 9 depicts in plan a substrate table according to an embodiment of the invention.
Figure 10:
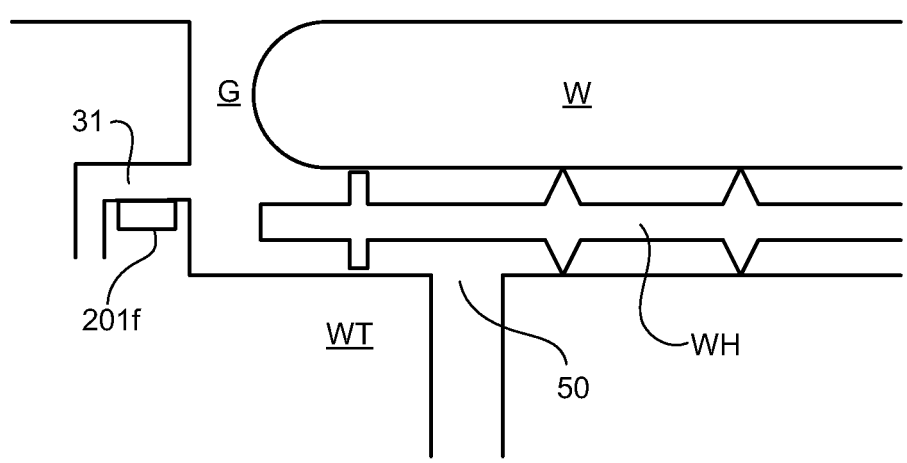
FIG. 10 depicts in cross-section arrangements around a gap between a substrate and a substrate table according to an embodiment of the invention.

Another embodiment of the present invention is shown in FIGS. 9 and 10. FIG. 9 is a schematic plan view of the substrate table WT, whilst FIG. 10 is a cross-section of the substrate table WT in the vicinity of the edge of wafer W. As can be seen, wafer W is supported by wafer holder WH in a recess in wafer table WT. Also present in the upper surface of the substrate table WT are sensors SS and TS as well as a cleaning station CS. A gap G is present between the edge of substrate W and the side wall of the recess in wafer table WT. Similar gaps may be present around the sensors SS and TS. When substrate table WT is moved to expose a target portion of substrate W close to an edge of the substrate, the area covered by immersion liquid 11 extends across the gap G, as illustrated in FIG. 9. When this occurs, immersion liquid 11 is lost into the gap G. To remove this liquid, a plurality of gap extraction conduits 31 are provided spaced around the gap G. In the Figure, eight extraction conduits 31 are provided but more or fewer may be used in other embodiments, for example there may be 3, 6 or 10 extraction outlets.

Because immersion liquid 11 will only be present in part of annular gap G at any given time, the pressure of immersion liquid 11 may exert a force on substrate table WT or substrate W in the plane of substrate W. Pressure sensors 201f are provided in each extraction conduit 31 in order to measure the pressure of immersion liquid 11, which is indicative of the force exerted on substrate table WT or substrate W. The pressure signal provided by pressure sensors 201f is taken into account by controller 202 to calculate the counteracting force to be exerted by positioner PW. Counteracting force fd may be a translation force in any direction or may be a rotational force, or a sum of translation and rotational forces.

In an embodiment of the invention, one or more pressure sensors may be provided in any other opening or conduit that in view of the apparatus receives a two-phase flow. For example, a pressure sensor may be provided in a fluid extraction opening 50 defined in the substrate table WT and positioned under the substrate and optionally under the substrate holder; a fluid extraction opening 55 defined in a surface of the substrate table WT at the edge of a shutter member CLD, 60; or a fluid extraction opening arranged to remove liquid from the space 11, for example outlet 13 when removing immersion liquid. The fluid extraction opening 50 is configured to remove liquid which leaks under the substrate. The liquid is removed to two-phase flow. The shutter member is used to retain liquid in the space 11 during substrate swap. A shutter member may be a closing disk CLD, a removable bridging device 60 or another table such as a second substrate table or a measurement table. As the surface underneath immersion space 11 changes from the surface of a substrate table to the surface of a shutter member CLD, 60 there may be a gap between the two surface into which liquid may flow. The fluid extraction opening or plurality of such openings removes the liquid which has escaped into the gap and the liquid may be extracted in a two-phase flow. The outlet 13 may be located near an upper meniscus of the immersion space between the projection system PS and the liquid confinement structure 13. Thus liquid may be extracted in a two-phase fluid flow.

An embodiment of the invention includes an immersion lithographic apparatus having a projection system arranged to project an image onto a substrate held by a substrate table through an immersion liquid provided in a space between the projection system and the substrate, the apparatus including:

a pressure sensor configured to generate a pressure signal indicative of the pressure of the immersion liquid in the space;

a positioner configured to position the substrate table relative to the projection system; and a control system responsive to the pressure signal and configured to control the force applied to the substrate table by the positioner.

In an embodiment, the pressure sensor is associated with an immersion fluid flow which flows out of the space through an opening in an opening surface.

An embodiment of the invention also includes an extraction conduit configured to extract immersion liquid from the space through the opening.

In an embodiment, the sensor is located in or near the extraction conduit.

In an embodiment, the extraction conduit and its associated opening is one of a plurality of extraction conduits each having an opening, the plurality of extraction conduits being configured to extract immersion liquid from the space.

In an embodiment, the openings of the plurality of extraction conduits define a pinning device in the opening surface, wherein the pinning device separates in use a part of the opening surface which is in contact with liquid and a part of the opening surface which is in contact with gas.

In an embodiment, the sensor is provided in the opening surface.

In an embodiment, the pressure sensor is located in the part of the opening surface which in use is in contact with liquid.

In an embodiment, the pressure sensor is located in the part of the opening surface which in use is in contact with gas.

An embodiment of the invention also includes a manifold in fluid communication with the extraction of conduits.

In an embodiment, the pressure sensor is arranged to measure the pressure in the manifold.

An embodiment of the invention also includes a further extraction conduit configured to extract fluid from the manifold; wherein the pressure sensor is arranged to measure the pressure in the further extraction conduit.

In an embodiment, the pressure sensor includes a plurality of spaced-apart pressure sensor elements.

In an embodiment, the opening surface faces a substrate, a substrate table or both.

An embodiment of the invention also includes a barrier member, the opening surface being a surface of a barrier member, wherein the barrier member is configured to at least partly confine the immersion liquid to the space.

In an embodiment, the barrier member surrounds the space.

In an embodiment, the fluid flow is a two-phase fluid flow including liquid.

In an embodiment, the control system includes a storage device configured to store a calibration function relating the pressure signal to a force exerted on the substrate table by the immersion liquid.

In an embodiment, the calibration function includes a gain value.

An embodiment of the invention is a device manufacturing method, including projecting a patterned beam of radiation onto a substrate held by a substrate table through an immersion liquid provided in a space adjacent the substrate using a lithographic apparatus, the method including:

measuring the pressure of the immersion liquid in the space; and controlling the force applied to the substrate table by a positioner responsive to the pressure.

An embodiment of the invention includes an immersion lithographic apparatus having a projection system arranged to project an image onto a substrate held by a substrate table through an immersion liquid provided in a space between the projection system and the substrate, the apparatus including:

an extraction conduit configured to extract immersion liquid from the space along with a gas in a two-phase flow; and a pressure sensor located in or near the inlet of the extraction conduit and configured to generate a signal indication of the pressure of the immersion liquid in the space.

In an embodiment, there are a plurality of extraction conduits configured to extract immersion liquid from the space along with a gas in a two-phase flow and a plurality of pressure sensors each located in or near the inlet of a respective one of the extraction conduits and configured to generate a signal indication of the pressure of the immersion liquid in the space.

In an embodiment, the number of pressure sensors is less than or equal to the number of extraction conduits.

In an embodiment, the plurality of extraction conduits form a meniscus pinning device configured to pin a meniscus of the immersion liquid in the space.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

In an immersion apparatus, immersion fluid is handled by a fluid handling system, device, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

A liquid supply system as contemplated herein should be broadly construed. In certain embodiments, it may be a mechanism or combination of structures that provides a liquid to a space between the projection system and the substrate and/or substrate table. It may include a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
    a projection system arranged to project an image onto a substrate held by a substrate table through an immersion liquid provided in a space between the projection system and the substrate;
    a pressure sensor configured to generate a pressure signal indicative of the pressure of the immersion liquid in the space the pressure sensor associated with an immersion fluid flow which flows out of the space through an opening in an opening surface;
    an extraction conduit configured to extract immersion liquid from the space through the opening;
    a positioner configured to position the substrate table to position the substrate table relative to the projection system; and
    a control system responsive to the pressure signal and configured to control a force applied to the substrate table by the positioner based on the pressure signal,
    wherein the sensor is located in the extraction conduit, and
    wherein the apparatus comprises an additional pressure sensor that is provided in the opening surface.

2. The apparatus of claim 1, wherein the extraction conduit and its associated opening is one of a plurality of extraction conduits each having an opening, the plurality of extraction conduits being configured to extract immersion liquid from the space.

3. The apparatus of claim 2, wherein the openings of the plurality of extraction conduits define a pinning device in the opening surface, wherein the pinning device separates in use a part of the opening surface which is in contact with liquid and a part of the opening surface which is in contact with gas.

4. The apparatus of claim 3, further comprising a manifold in fluid communication with the extraction conduits.

5. The apparatus of claim 4, wherein the pressure sensor is arranged to measure the pressure in the manifold.

6. The apparatus of claim 4, further comprising:
    a further extraction conduit configured to extract fluid from the manifold;
    wherein the pressure sensor is arranged to measure the pressure in the further extraction conduit.

7. The apparatus of claim 2, wherein the pressure sensor comprises a plurality of spaced-apart pressure sensor elements.

8. The apparatus of claim 1, wherein the pressure sensor is located in the part of the opening surface which in use is in contact with liquid.

9. The surface of claim 1, wherein the pressure sensor is located in the part of the opening surface which in use is in contact with gas.

10. The apparatus of claim 1, wherein the opening surface faces a substrate, a substrate table or both.

11. The apparatus of claim 10, further comprising a barrier member, the opening surface being a surface of a barrier member, wherein the barrier member is configured to at least partly confine the immersion liquid to the space.

12. The apparatus of claim 11, wherein the barrier member surrounds the space.

13. The apparatus of claim 1, wherein the fluid flow is a two-phase fluid flow comprising liquid.

14. The apparatus of claim 1, wherein the control system comprises a storage device configured to store a calibration function relating the pressure signal to a force exerted on the substrate table by the immersion liquid.

15. The apparatus of claim 14, wherein the calibration function comprises a gain value.

16. The apparatus of claim 1, wherein the positioner includes a long stroke module and a short module to move the substrate table relative to the projection system.

17. A device manufacturing method, comprising:
projecting a patterned beam of radiation onto a substrate held by a substrate table through an immersion liquid provided in a space adjacent the substrate using a lithographic apparatus;
measuring the pressure of the immersion liquid in the space using a pressure sensor associated with an immersion fluid flow which flows out of the space through an opening in an opening surface; and
controlling a force applied to the substrate table by a positioner responsive to the pressure, the positioner adapted to move the substrate table to position the substrate table relative to a projection system that is adapted to project the pattern beam of radiation, the force being controlled based on a pressure signal,
wherein the pressure sensor is located in an extraction conduit configured to extract immersion liquid from the space through the opening, and
wherein the apparatus comprises an additional pressure sensor that is provided in the opening surface.

18. An immersion lithographic apparatus comprising:
a projection system arranged to project an image onto a substrate held by a substrate table through an immersion liquid provided in a space between the projection system and the substrate;
an extraction conduit configured to extract immersion liquid from the space, through an inlet formed in a surface, along with a gas in a two-phase flow, wherein the surface faces a substrate, a substrate table or both; and
a pressure sensor located in the inlet of the extraction conduit and configured to generate a signal indication of the pressure of the immersion liquid in the space, and
an additional pressure sensor that is provided in the surface.

19. The apparatus of claim 18, comprising a plurality of extraction conduits configured to extract immersion liquid from the space along with a gas in a two-phase flow and a plurality of pressure sensors each located in or near the inlet of a respective one of the extraction conduits and configured to generate a signal indication of the pressure of the immersion liquid in the space.

20. The apparatus of claim 19, wherein the number of pressure sensors is less than or equal to the number of extraction conduits.

21. The apparatus of claim 19, wherein the plurality of extraction conduits form a meniscus pinning device configured to pin a meniscus of the immersion liquid in the space.

* * * * *